United States Patent [19]
McCaslin

[11] Patent Number: 5,198,992
[45] Date of Patent: Mar. 30, 1993

[54] METHOD AND APPARATUS FOR IMPROVING WIDEBAND DETECTION OF A TONE

[76] Inventor: Shawn McCaslin, 61 Simpson, Cedar Creek, Tex. 78612

[21] Appl. No.: 864,259

[22] Filed: Apr. 6, 1992

[51] Int. Cl.$^5$ ............................................. G06F 15/31
[52] U.S. Cl. .............................................. 364/724.09
[58] Field of Search ...................... 364/724.09, 724.08

[56] References Cited

U.S. PATENT DOCUMENTS

| | | | |
|---|---|---|---|
| 4,038,540 | 7/1977 | Roberts | 364/724.09 |
| 4,164,036 | 8/1979 | Wax | 364/724.09 X |
| 4,351,032 | 9/1982 | Challen | 364/724.09 |
| 4,989,167 | 1/1991 | McCaslin et al. | 364/724.09 |

FOREIGN PATENT DOCUMENTS 63-253713  10/1988  Japan ......................... 364/708

*Primary Examiner*—Tan V. Mai
*Attorney, Agent, or Firm*—Paul J. Polansky; Maurice (Jay) Jones

[57] ABSTRACT

An in-phase signal is sampled at an input of a first analog-to-digital converter (41), and a quadrature signal is sampled at an input of a second analog-to-digital converter (42). The output of the first analog-to-digital converter (41) is delayed by an amount equal to one, plus an integer number times four, sample periods to provide a delayed in-pahse signal. Then the delayed in-phase signal is added to the quadrature signal to provide a sum signal. Then a tone is detected in the sum signal. In one embodiment, a data processor (32) stores the output of the analog-to-digital converters (41, 42) in memory (34) and processes the data as programmed by microcode (33).

10 Claims, 2 Drawing Sheets

METHOD AND APPARATUS FOR IMPROVING WIDEBAND DETECTION OF A TONE

CROSS REFERENCE TO RELATED, COPENDING APPLICATION

Related, copending application is application Ser. No. 07/740,235, filed Aug. 5, 1991, now U.S. Pat. No. 5,136,531, issued Aug. 4, 1992, by Shawn McCaslin and assigned to the assignee hereof, entitled "Method and Apparatus for Detecting a Wideband Tone."

FIELD OF THE INVENTION

This invention relates generally to a signal processing method and apparatus, and more particularly, to a signal processing method and apparatus for wideband detection of a tone.

BACKGROUND OF THE INVENTION

In applications such as telecommunications it is often necessary to detect certain special signals which may be present in the telecommunication signal stream. For example, in the DTMF telephone system, it is necessary to detect two tones to decode a key pressed on a telephone keypad. In the DTMF system, a tone detector must detect the presence of two of several possible tones to decode one of twelve telephone keys. The tone detector must reliably discriminate between tones and such sounds as the human voice and background noise. In the DTMF system, the frequencies at which the predetermined tones are expected are known with little uncertainty, making tone detection easier.

A tone is a sinusoidal wave at a specific frequency. One method of tone detection used in DTMF systems is to pass the input signal through a narrow-bandwidth bandpass filter, and then to measure the power in the bandpass-filtered signal. If a tone is present in the input signal, a high power level will be measured in the bandpass-filtered signal. The tone is detected by comparing the power in the bandpass-filtered signal with the power in another band of frequencies. This other band of frequencies is selected to exclude any possible tone frequency, such as the second harmonic of the highest expected tone frequency. If the power in the first bandpass-filtered signal exceeds the power in the other passband of frequencies by a predetermined threshold, then a tone is detected. If no tone is present, then the power measured in the bandpass-filtered signal will not exceed the power in the other band by the threshold. A change in the power ratio can also be used to determine the time at which the tone started or ended. A false-to-true transition in the power-ratio decision signifies a leading edge of the tone; a true-to-false transition in the power-ratio decision signifies a trailing edge of the tone.

In other applications, a tone is expected at a frequency anywhere within a wide range. If the bandwidth of the bandpass filter is made wide enough to include any possible frequency for the tone, then significant amounts of other components such as additive white Gaussian (AWG) noise are also included, and the power-ratio decision may falsely indicate a tone when only the white noise is present. The robustness with which tones can be detected in the presence of this white noise can be a limiting factor of the communications system. Thus, new methods and systems for tone detection in the presence of noise are needed.

SUMMARY OF THE INVENTION

Accordingly, there is provided, in one form, a method for improving wideband detection of a tone. An in-phase signal is sampled at an input of a first analog-to-digital converter. A quadrature signal is sampled at an input of a second analog-to-digital converter. An output of the first analog-to-digital converter is delayed by an amount equal to one, plus an integer number times four, sample periods to provide a delayed in-phase signal. The delayed in-phase signal is added to the quadrature signal to provide a sum signal. The tone is detected in the sum signal.

These and other features and advantages will be more clearly understood from the following detailed description taken in conjunction with the accompanying drawings.

DETAILED DESCRIPTION OF THE INVENTION

Figure 1:
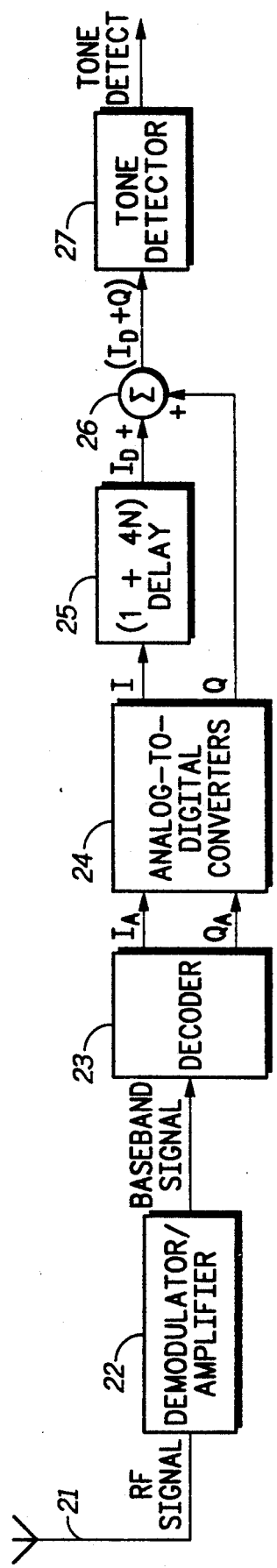
FIG. 1 illustrates in block diagram form a functional block diagram of a mixed signal processing system 20 in accordance with the present invention.

FIG. 1 illustrates in block diagram form a functional block diagram of a mixed signal processing system 20 in accordance with the present invention. A baseband signal from another station (not shown) is modulated up to the RF frequency. The baseband signal is an analog signal which is encoded using an encoding scheme such as GMSK, FSK, or the like. An antenna 21 receives the modulated signal, labelled "RF SIGNAL". Demodulator/amplifier 22 is connected to antenna 21 and demodulates RF SIGNAL down to baseband, and amplifies the signal suitably for further processing, to provide a signal labelled "BASEBAND SIGNAL". BASEBAND SIGNAL is then provided to a decoder 23 where it is decoded to provide an in-phase signal labelled "$I_A$" and a quadrature signal labelled "$Q_A$". Signal $Q_A$ is 90 degrees out-of-phase with signal $I_A$. Analog-to-digital converters (ADCs) 24 include two separate ADCs, one for the in-phase channel receiving signal $I_A$ and providing a digital, in-phase signal labelled "I" in response, and another for the quadrature channel receiving signal $Q_A$ and providing a digital quadrature signal labelled "Q". ADCs 24 sample the received signal at twice the Nyquist rate (four times the highest expected frequency component). In the illustrated embodiment, the two ADCs in ADCs 24 are 8-bit ADCs. Then, a delay element 25 receives signal I and delays it by (1+4N) sample periods, where N is an integer, to provide a delayed in-phase signal labelled "$I_D$". A summing device 26 receives signal $I_D$ and Q at respective input terminals thereof, and provides a sum signal at an output thereof labelled "$(I_D+Q)$". Sum signal $(I_D+Q)$ is then provided to tone detector 27, which performs tone detection thereon to provide a signal labelled "TONE DETECT" in response to detecting a tone in the sum signal. In the illustrated embodiment, tone detector 26 is the tone detector disclosed in U.S. patent application Ser. No. 07/740,235, filed Aug. 5, 1991, now U.S. Pat. No. 5,136,531, issued Aug. 4, 1992, by Shawn McCaslin and assigned to the assignee hereof, entitled "Method and Apparatus for Detecting a Wideband Tone," which is herein incorporated by reference. However, a conventional tone detector may also be used.

System 20 detects the presence of a wideband tone in the received signal. Both the I and Q channels receive the same tone, only 90 degrees out of phase. If the noise is white, it is random with respect to frequency in the bandwidth of interest. The white noise is not correlated versus time (i.e., it has an impulse autocorrelation function). Thus, by delaying the I signal to make the tone component in-phase with the Q signal, and adding the $I_D$ signal to the Q signal, tone detector 26 receives a signal with a higher tone signal in relation to the noise. System 20 provides an ideal improvement in signal-to-noise ratio of 3 decibels (dB), which is equal to the square root of 2.

Since the frequency of the tone may not equal the nominal frequency, however, the SNR improvement is only 3 dB exactly at the expected frequency, and drops off somewhat as the frequency departs from the expected frequency. In addition, the assumption that the noise is not correlated may not be entirely valid. Because noise may be correlated over a short time, such as one sample, it may be necessary to increase the value of N in order to reduce the correlation. However, there is a penalty in that for higher values of N, the SNR improvement decreases more sharply as the actual frequency departs from the expected frequency.

Figure 2:
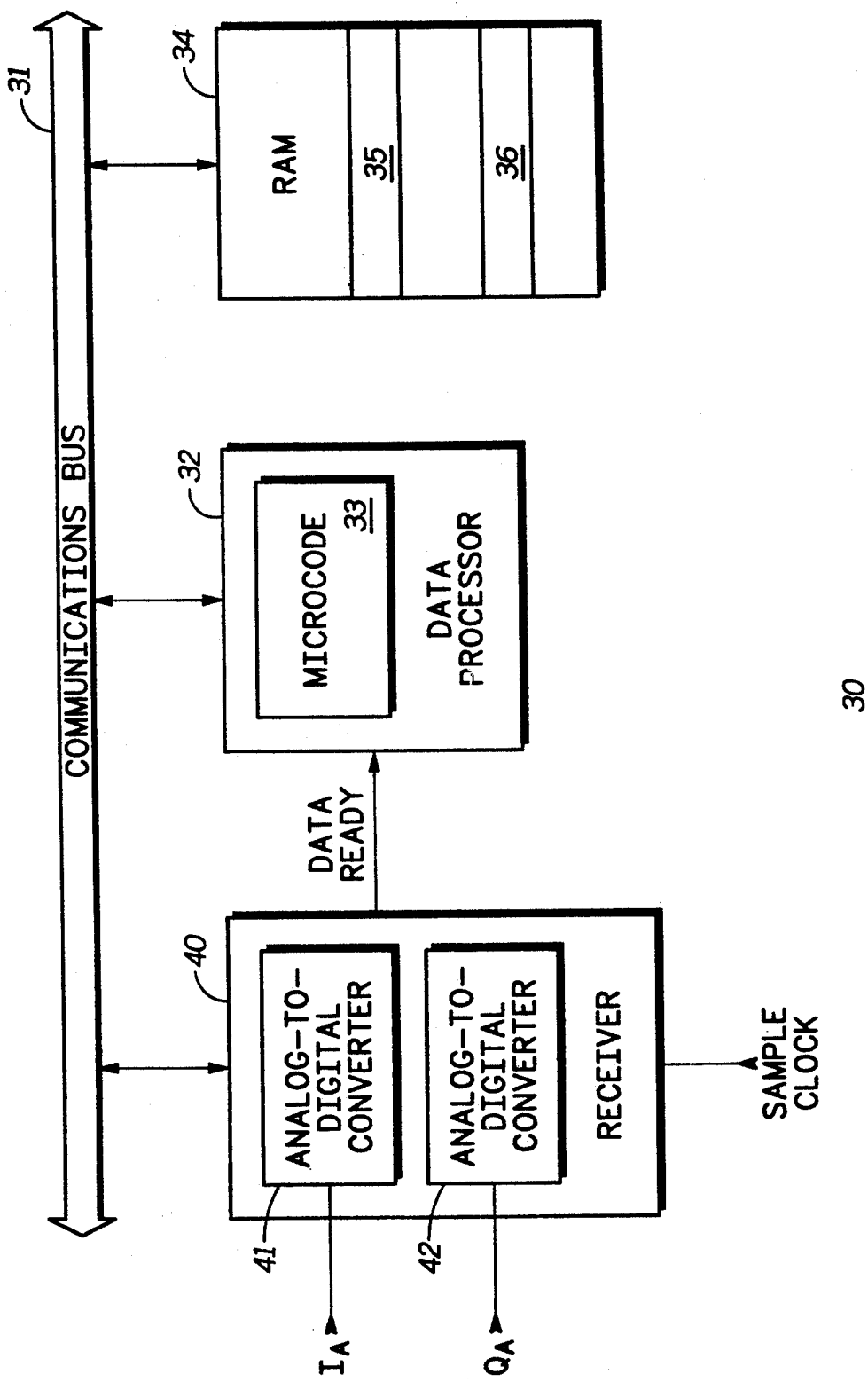
FIG. 2 illustrates a block diagram of a mixed signal processing system 30 for performing the functions of FIG. 1.

The blocks of mixed signal processing system 20 may be implemented entirely with hardware circuitry, or with a combination of hardware circuitry and by manipulation by software or microcode running on a data processor. The illustrated embodiment implements the present invention with such a combination of hardware circuitry and microcode running on a data processor as more particularly illustrated in FIG. 2. FIG. 2 illustrates a block diagram of a mixed signal processing system 30 for performing the functions of FIG. 1. In the illustrated embodiment, mixed signal processing 30 is implemented as a conventional integrated circuit. Mixed signal processing system 30 includes a receiver 40 which includes an I-channel ADC 41 and a Q-channel ADC 42 implemented as conventional hardware circuitry. Receiver 40 receives a sample clock which is equal to twice the Nyquist rate. Receiver 40 also includes an interface to a communications bus 31 for conducting control and data signal associated with the operation of receiver 40. Receiver 40 also provides a signal labelled "DATA READY" to a data processor 32 to indicate that a demodulated, decoded digital word of data is completed. Data processor 32 is a data processor optimized for digital signal processing (DSP) applications and includes a microcode 33. Microcode 33 includes programming for data processor 32 to perform its associated signal processing and data manipulation tasks. Data processor 32 has an interface to communications bus 31 to conduct address, control, and data signals thereon. When receiver 40 provides signal DATA READY, a program in microcode 32 causes data processor 32 to access the data word provided by receiver 40 and to store the data word in a random access memory 34, also connected to communications bus 31, in response.

In particular, data processor 32 receives a DATA READY indication from receiver 40 and provides address and control signals to communications bus 31 to cause the received data word to be stored in RAM 34. Two data locations, 35 and 36, are illustrated. Data processor 32 stores the received I data word in data location 35. After (1+4N) samples, data processor 32 also stores the Q data word in a second location 36. Thus, the in-phase data word in location 35 is delayed by (1+4N) samples from the quadrature data word in location 36. Microcode 33 includes instructions which cause data processor to add the contents of data locations 35 and 36, and provide the sum to a tone detection function. Thus, functions corresponding to blocks 25, 26, and 27 of FIG. 1 are performed through microcode 33 running on data processor 32. It should be apparent however, that different combinations of hardware and software are also possible.

While the invention has been described in the context of a preferred embodiment, it will be apparent to those skilled in the art that the present invention may be modified in numerous ways and may assume many embodiments other than that specifically set out and described above. For example, while GMSK provides the most efficient decoding scheme, tone detection according to the present invention may be performed on signals using other decoding schemes such as FSK as well. Accordingly, it is intended by the appended claims to cover all modifications of the invention which fall within the true spirit and scope of the invention.

I claim:
1. A method for improving wideband detection of a tone, comprising the steps of:
    sampling an in-phase signal at an input of a first analog-to-digital converter;
    sampling a quadrature signal at an input of a second analog-to-digital converter;
    delaying an output of said first analog-to-digital converter by an amount equal to one, plus an integer number times four, sample periods to provide a delayed in-phase signal;
    adding said delayed in-phase signal to an output of said second analog-to-digital converter to provide a sum signal; and
    detecting a tone in said sum signal.

2. The method of claim 1 wherein the step of detecting comprises the step of receiving said sum signal at an input of a tone detector, said tone detector providing a tone detect signal at an output thereof in response to detecting a tone exceeding a predetermined threshold in a predetermined frequency band.

3. The method of claim 1 wherein said step of sampling said in-phase signal further comprises sampling said in-phase signal at twice a Nyquist rate of said in-phase signal, and wherein said step of sampling said quadrature signal further comprises sampling said quadrature signal at twice said Nyquist rate.

4. An apparatus for wideband detection of a tone, comprising:
    a first analog-to-digital converter having an input for receiving an analog in-phase signal, and an output for providing a digital in-phase signal;
    a second analog-to-digital converter having an input for receiving an analog quadrature signal, and an output for providing a digital quadrature signal;
    a delay element having an input coupled to said output of said first analog-to-digital converter, and an output for providing a delayed in-phase signal, said delay element delaying said in-phase signal by one plus an integer number times four sample periods to provide said delayed in-phase signal;
    a summing device having a first input coupled to said output of said delay element, a second input coupled to said output of said second analog-to-digital converter, and an output; and a tone detector having an input coupled to said output of said summing device, and an output for providing a tone detect signal.

5. The apparatus of claim 4 further comprising:

an antenna for receiving a radio-frequency signal;

a demodulator having an input coupled to said antenna, and an output for providing a baseband signal; and a decoder having an input for receiving said baseband signal, and first and second outputs for respectively providing said analog in-phase signal and said analog quadrature signal in response thereto.

6. The apparatus of claim 5 wherein said radio-frequency signal is characterized as being a GMSK-encoded radio-frequency signal.

7. The apparatus of claim 5 wherein said radio-frequency signal is characterized as being an FSK-encoded radio-frequency signal.

8. A signal processing system comprising:

a communications bus;

a plurality of memory storage elements coupled to said communications bus;

a first analog-to-digital converter having an input for receiving an analog in-phase signal, and an output coupled to said communications bus for providing a digital in-phase signal;

a second analog-to-digital converter having an input for receiving an analog quadrature signal, and an output coupled to said communications bus for providing a digital quadrature signal;

means for providing a data ready indication in response to both said first analog-to-digital converter completing a sample of said digital in-phase signal and said second analog-to-digital converter completing a sample of said digital quadrature signal; and a data processor coupled to said communications bus, for activating said first and second analog-to-digital converters to provide, and said plurality of memory storage elements to store, said digital in-phase signal and said digital quadrature signal in response to said data ready indication, for providing a sum of said digital quadrature signal and, said digital in-phase signal delayed by one plus four times an integer number of sample periods from said quadrature signal, and for detecting a tone in said sum.

9. The signal processing system of claim 8 wherein said plurality of memory storage elements comprises a random access memory.

10. The signal processing system of claim 8 wherein said data processor includes microcode means for storing a plurality instructions of said data processor.

* * * * *